United States Patent
Jen et al.

(10) Patent No.: US 9,960,111 B2
(45) Date of Patent: May 1, 2018

(54) MECHANISMS FOR FORMING METAL-INSULATOR-METAL (MIM) CAPACITOR STRUCTURE

(71) Applicant: TAIWAN SEMICONDUCTOR MANUFACTURING CO., LTD., Hsinchu (TW)

(72) Inventors: Chi-Chung Jen, Kaohsiung (TW); Chia-Lun Hsu, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days. days.

(21) Appl. No.: 15/131,867

(22) Filed: Apr. 18, 2016

(65) Prior Publication Data

US 2016/0233158 A1    Aug. 11, 2016

Related U.S. Application Data

(62) Division of application No. 14/069,864, filed on Nov. 1, 2013, now Pat. No. 9,324,780.

(51) Int. Cl.
*H01L 23/522* (2006.01)
*H01L 49/02* (2006.01)
*H01L 23/00* (2006.01)

(52) U.S. Cl.
CPC ...... *H01L 23/5223* (2013.01); *H01L 23/5226* (2013.01); *H01L 24/05* (2013.01); *H01L 28/60* (2013.01); *H01L 2224/0401* (2013.01); *H01L 2224/05024* (2013.01); *H01L 2224/13* (2013.01)

(58) Field of Classification Search
CPC . H01L 23/5223; H01L 27/0805; H01L 28/40; H01L 27/224
See application file for complete search history.

(56) References Cited

U.S. PATENT DOCUMENTS

| | | |
|---|---|---|
| 7,440,334 B2 | 10/2008 | Barth et al. |
| 2006/0164876 A1 | 7/2006 | Barth et al. |
| 2009/0309212 A1 | 12/2009 | Shim et al. |
| 2012/0112314 A1* | 5/2012 | Jou ............ H01L 23/5223 257/532 |
| 2012/0161279 A1* | 6/2012 | Lin ............ H01L 21/561 257/531 |

* cited by examiner

*Primary Examiner* — Jay C Chang
*Assistant Examiner* — Mikka Liu
(74) *Attorney, Agent, or Firm* — Birch, Stewart, Kolasch & Birch, LLP (57) ABSTRACT

A method for forming a metal-insulator-metal (MIM) capacitor structure is provided. The method includes providing a substrate and forming an interconnect structure over the substrate. The interconnect structure includes a top metal layer, and wherein the top metal layer includes a first portion and a second portion. The method includes forming an insulating layer on the first portion of the top metal layer; and forming a metal pad on the insulating layer. The metal pad includes a first portion and a second portion, the MIM capacitor is constructed by the first portion of the top metal layer, the insulating layer and the first portion of the metal pad, and the second portion of the metal pad directly contacts the first portion of the metal pad and the second portion of the top metal layer.

20 Claims, 7 Drawing Sheets

MECHANISMS FOR FORMING METAL-INSULATOR-METAL (MIM) CAPACITOR STRUCTURE

CROSS REFERENCE TO RELATED APPLICATIONS

This application is a Divisional application of co-pending application Ser. No. 14/069,864, filed on Nov. 1, 2013, the entire content of which is hereby incorporated by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of capacitor is a metal-insulator-metal (MIM) capacitor, which is used in mixed signal devices and logic devices, such as embedded memories and radio frequency devices. Metal-insulator-metal capacitors are used to store a charge in a variety of semiconductor devices. A metal-insulator-metal capacitor is formed horizontally on a semiconductor wafer, with two metal plates sandwiching a dielectric layer parallel to the wafer surface. However, there are many challenges related to the MIM capacitor.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional steps can be provided before, during, and after the method, and some of the steps described can be replaced or eliminated for other embodiments of the method.

Figure 1:
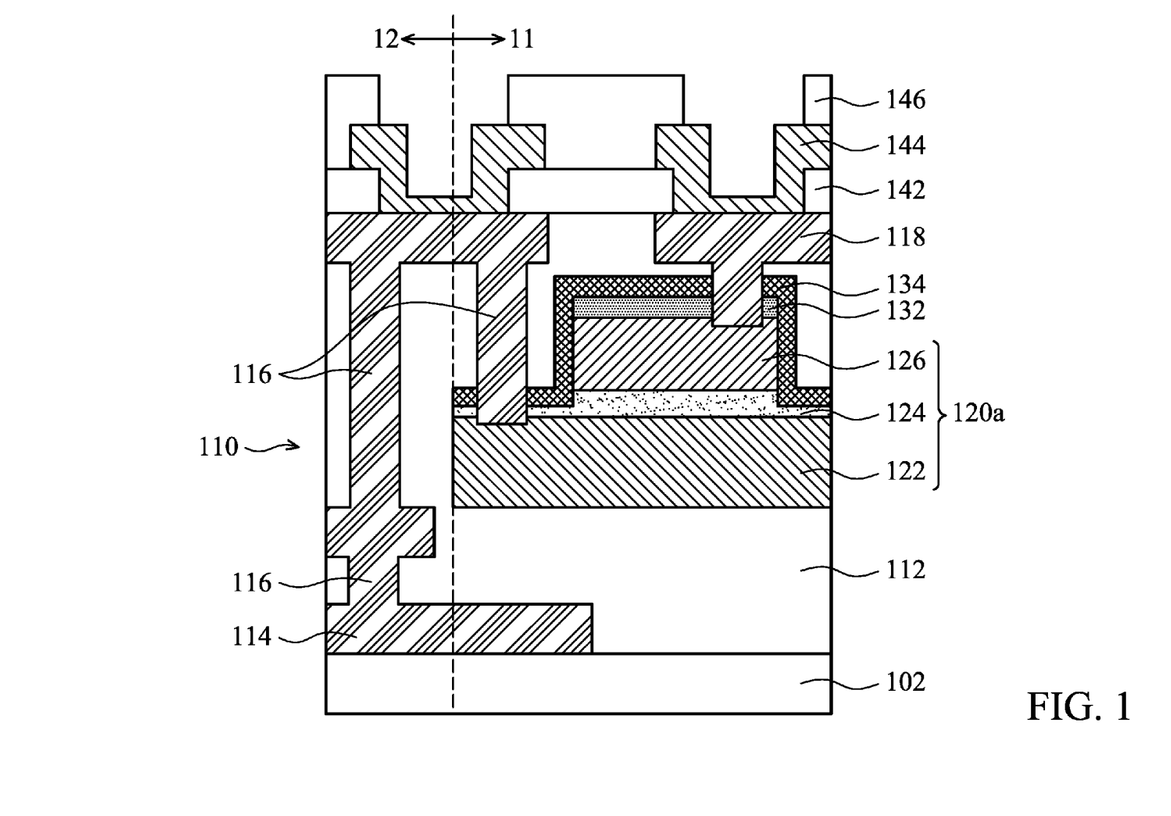
FIG. 1 shows a cross-sectional representation of a semiconductor device with metal-insulator-metal (MIM) capacitor structure in accordance with some embodiments of the disclosure.

Embodiments of mechanisms for forming a semiconductor device with a metal-insulator-metal (MIM) capacitor structure are provided. FIG. 1 shows a cross-sectional representation of a semiconductor device with the MIM capacitor structure 120a in accordance with some embodiments of the disclosure.

Referring to FIG. 1, a substrate 102 is provided. Substrate 102 includes a MIM region 11 and a non-MIM region 12. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

Substrate 102 may further include isolation features (not shown), such as shallow trench isolation (STI) features or local oxidation of silicon (LOCOS) features. The isolation features may define and isolate various integrated circuit devices. Integrated circuit devices, such as metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements, are formed in and/or on substrate 102.

An interconnect structure 110 is formed over substrate 102. In some embodiments, interconnect structure 110 including metal lines 114 and vias 116 is embedded in inter-metal dielectric (IMD) layers 112. In some embodiments, interconnect structure 110 is formed in a back-end-of-line (BEOL) process. Metal lines 114 and vias 116 may be made of conductive material, such as copper (Cu), aluminum (Al), tungsten (W), or applicable materials. In some embodiments, metal lines 114 and vias 116 are copper or copper alloy. In some embodiments, metal lines 114 and vias 116 are formed by single and/or dual damascence processes. Metal lines 114 include multiple metal layers (namely M1, M2, M3 . . . , and Mtop) which are interconnected through vias 116.

In some embodiments, inter-metal dielectric (IMD) layers 112 are made of silicon oxide. In some other embodiments, IMD layers 112 are made of un-doped silicate glass (USG), fluorinated silicate glass (FSG), carbon-doped silicate glass, silicon nitride or silicon oxynitride. In some embodiments, IMD layers 112 include multiple dielectric layers. One or more of the multiple dielectric layers are made of low dielectric constant (low-k) materials, such as a dielectric constant of less than about 3.0, or less than about 2.5. Interconnect structure 110 shown in FIG. 1 is merely for illustrative purposes. Interconnect structure 110 may include other configurations and may include one or more metal lines and IMD layers.

As shown in FIG. 1, an MIM capacitor 120a is formed over substrate 102 in MIM region 11. MIM capacitor 120a is a sandwich structure and an insulating layer 124 is formed between a capacitor bottom metal (CBM) layer 122 and a capacitor top metal (CTM) layer 126. In some embodiments, a barrier layer, such as titanium nitride (TiN), is formed over CBM layer 122 or CTM layer 126.

CBM layer 122 is formed by a procedure including depositing, photolithography, and etching processes. The deposition processes include chemical vapor deposition (CVD), physical vapor deposition (PVD), atomic layer deposition (ALD), or applicable methods. The photolithography processes include photoresist coating (e.g., spin-on coating), soft baking, mask aligning, exposure, post-exposure baking, developing the photoresist, rinsing, and drying (e.g., hard baking). The etching processes include dry etching, wet etching, and/or other etching methods. In addition, CTM layer 126 is also formed by a procedure including depositing, photolithography, and etching processes.

As shown in FIG. 1, etch stop layers 132, 134 are formed over MIM capacitor 120a. In some other embodiments, no etch stop layer is formed over MIM capacitor 120a. In some embodiments, etch stop layer 132 is made of silicon oxynitride (SION). In some embodiments, etch stop layer 134 is made of oxide.

After formation MIM capacitor 120a, one of vias 116 is formed in IMD layer 112 to electrically connect CBM layer 122, one of vias 116 is formed in IMD layer 112 to electrically connect CTM layer 126. A top metal layer 118 (also called $M_{top}$) is formed over vias 116. Top metal layer 118 is furthest away from the first metal layer $M_1$.

As shown in FIG. 1, a first passivation layer 142 is formed over top metal layer 118, and a metal pad 144 is formed in first passivation layer 142. A second passivation layer 146 is formed on metal pad 144 and first passivation layer 142.

It should be noted that a step difference is formed between MIM region 11 and non-MIM region 12 because MIM capacitor 120a is formed in MIM region 11. The step difference may cause a topography problem. Top metal layer 118 formed in MIM region 11 and in non-MIM region 12 respectively have different optimized patterning conditions. Therefore, the process window for patterning top metal layer 118 is reduced.

In addition, after forming top metal layer 118, a planarizing process (e.g. CMP) is performed on top metal layer 118. However, the planarizing process is not easy to control due to the step difference. Furthermore, CBM layer 122 and CTM layer 126 are formed by two forming processes including a deposition process, a photolithography process and an etching process. Therefore, the fabrication time and cost are high. In order to resolve the topography problem and reduce the fabrication cost, some embodiments are provided.

FIGS. 2A-2F shows cross-sectional representations of various stages of forming a semiconductor device with a MIM capacitor structure 120b in accordance with some embodiments of the disclosure. However, it should be noted that FIGS. 2A-2F have been simplified for the sake of clarity to better understand the inventive concepts of the disclosure. Additional features can be added in semiconductor device structure 100, and some of the features below can be replaced or eliminated.

Figure 2A:
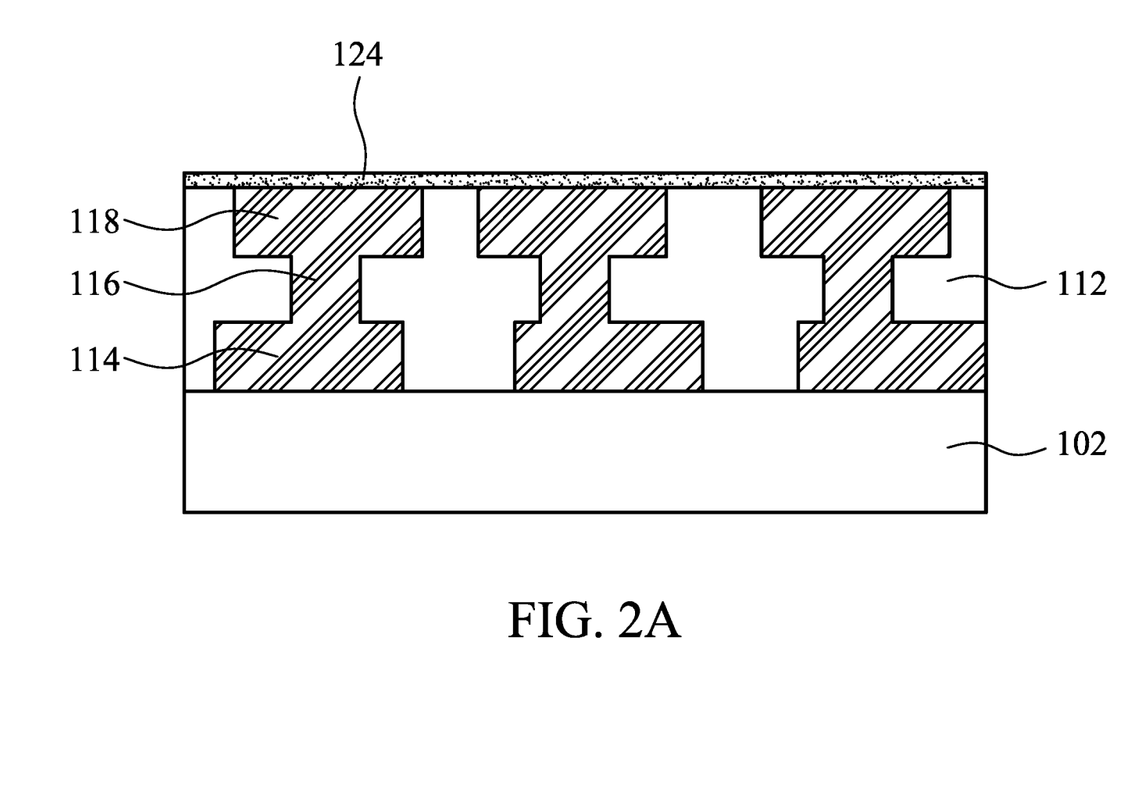
FIGS. 2A-2F shows cross-sectional representations of various stages of forming a semiconductor device with a metal-insulator-metal (MIM) capacitor structure in accordance with some embodiments of the disclosure.

Referring to FIG. 2A, substrate 102 is provided. Interconnect structure 110 is formed over substrate 102. In some embodiments, interconnect structure 110 including metal lines 114 and vias 116 is embedded in inter-metal dielectric (IMD) layers 112. Top metal layer 118 (also called $M_{top}$) is formed over vias 116.

In some embodiments, top metal layer 118 is made of copper (Cu), copper alloy, aluminum (Al), aluminum (Al) alloy, tungsten (W) or tungsten (W) alloy. In some embodiments, top metal layer 118 is formed by a physical vapor deposition (PVD) process. In some embodiments, a barrier layer, such as titanium nitride (TiN), is formed over top metal layer 118.

After top metal layer 118 is formed, insulating layer 124 is formed on top metal layer 118. In some embodiments, insulating layer 124 is made of dielectric materials, such as silicon oxide, silicon nitride or silicon glass. In some embodiments, insulating layer 124 is formed by a plasma enhanced chemical vapor deposition (PECVD) process. In some embodiments, insulating layer 124 has a thickness in a range from about 50A to about 500A.

Figure 2B:
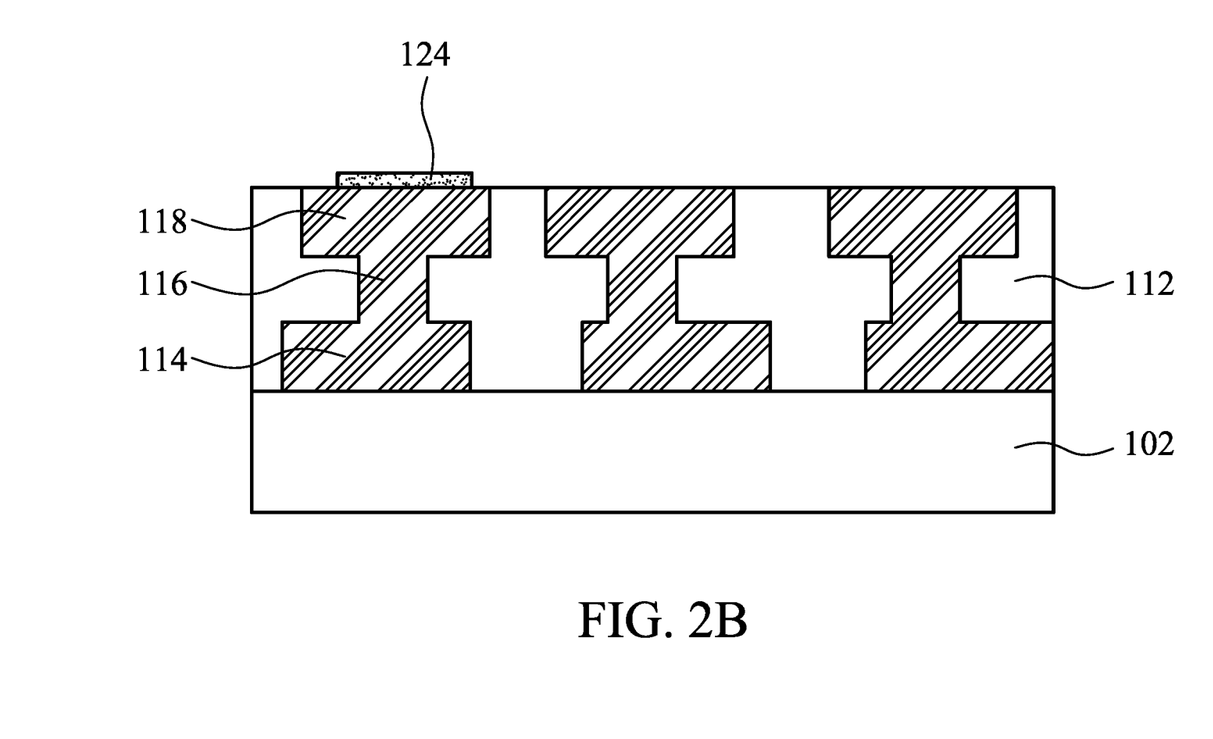

After insulating layer 124 is formed, insulating layer 124 is patterned to remove a portion of insulating layer 124 and to form patterned insulating layer 124 as shown in FIG. 2B in accordance with some embodiments of the disclosure. The patterned insulating layer 124 is formed over a portion of top metal layer 118 by a photolithography process and an etching process. The photolithography process includes processing steps of photoresist coating, soft baking, mask aligning, exposing, post-exposure baking, developing photoresist and hard baking. The etching process includes a wet etching process or a dry etching process. Insulating layer 124 is used as an insulator between a top electrode and a bottom electrode of MIM capacitor 120b (will be described in detail later).

Figure 2C:
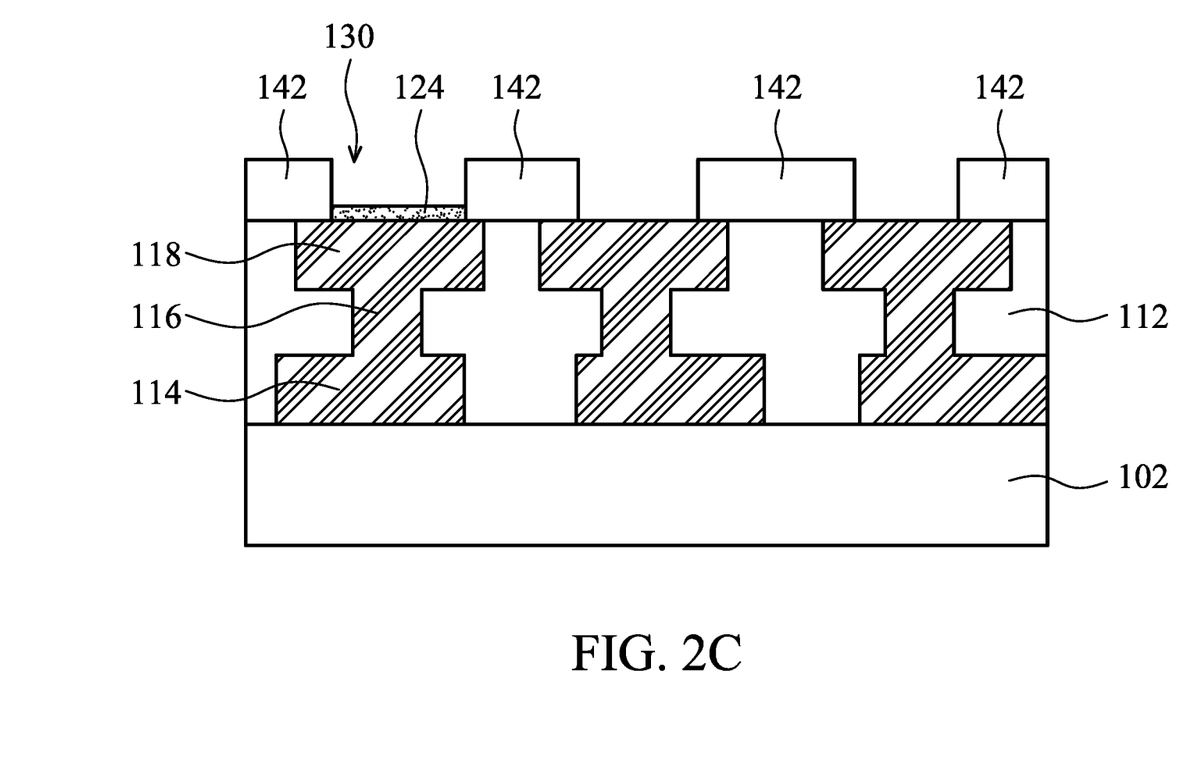

After insulating layer 124 is patterned, first passivation layer 142 is formed on insulating layer 124 and top metal layer 118 as shown in FIG. 2C in accordance with some embodiments of the disclosure. Afterwards, first passivation layer 142 is patterned by a photolithography process and an etching process. As shown in FIG. 2C, a trench 130 is formed in first passivation layer 142 to expose insulating layer 124.

First passivation layer 142 is made of made of oxide, nitride or oxynitride. In some embodiments, first passivation layer 142 is formed by a chemical vapor deposition (CVD), atomic layer deposition (ALD), physical vapor deposition (PVD), or other applicable processes.

After first passivation layer 142 is patterned, metal pad 144 is formed on first passivation layer 142 and insulating layer 124 as shown in FIG. 2C in accordance with some embodiments of the disclosure. Afterwards, metal pad 144 is patterned by a photolithography process and an etching process. In some embodiments, metal pad 144 is made of conductive material, such as copper (Cu), copper alloy, aluminum (Al), aluminum (Al) alloy, tungsten (W) or tungsten (W) alloy or applicable materials. In some embodiments, a barrier layer 145, such as titanium nitride (TiN), is formed over metal pad 144.

Figure 2D:
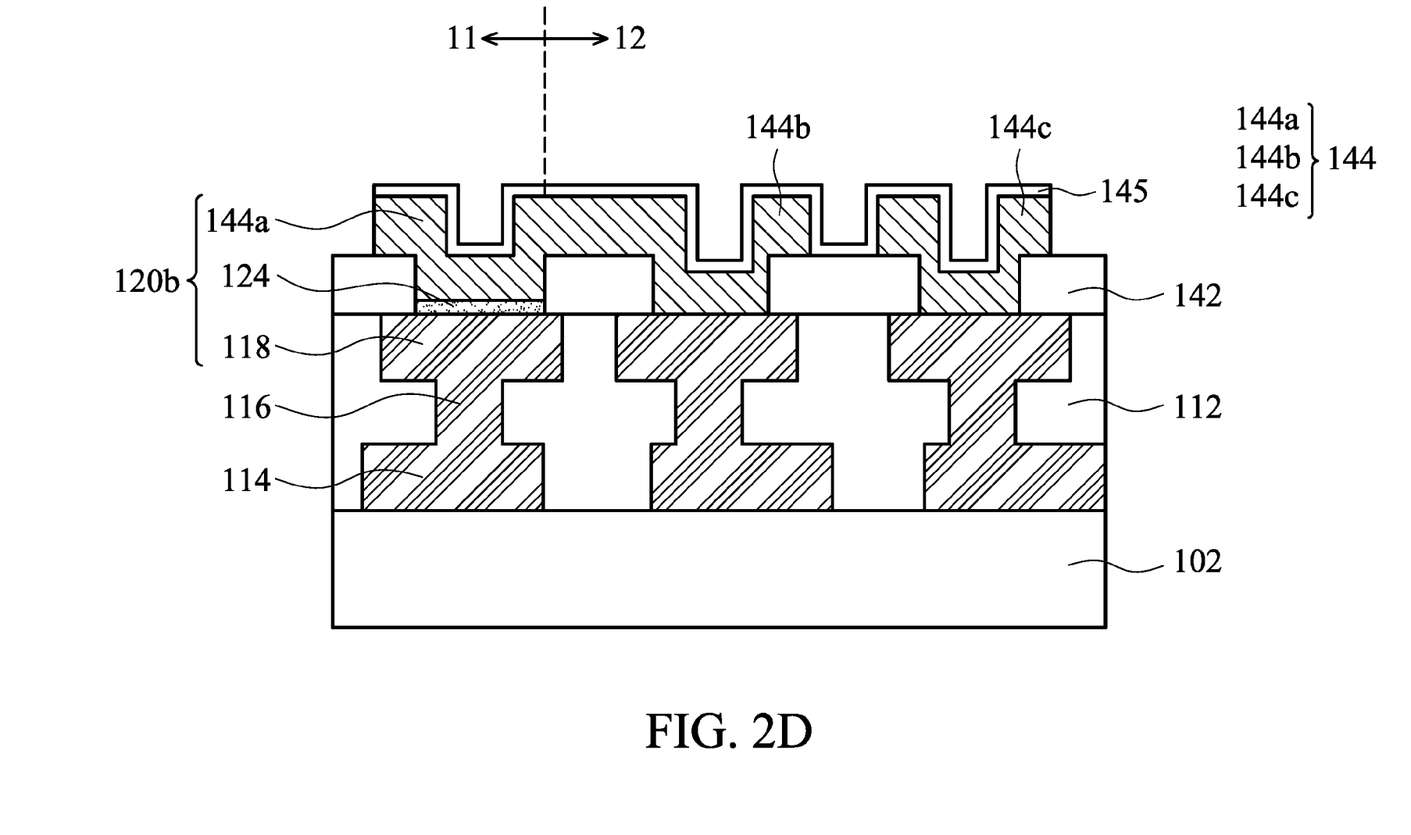

It should be noted that MIM capacitor 120b is constructed by top metal layer 118, insulating layer 124 and metal pad 144. MIM region 11 having MIM capacitor 120b and non-MIM region 12 without MIM capacitor are therefore defined. Metal pad 144 includes a first portion 144a, a second portion 144b and third portion 144c. First portion 144a is formed over insulating layer 124 in MIM region 11. Second portion 144b is coupled with first portion 144a or extends from first portion 144a. Second portion 144b is directly formed on top metal layer 118 in non-MIM region 12. Third portion 144c is directly on top metal layer 118 in non-MIM region 12.

The three portions of metal pad 144 each have their respective functions. First portion 144a of metal pad 144 is used as a top electrode (plate) of MIM capacitor 120b. Second portion 144b is used as a redistribution layer (RDL) for connecting to other devices. Third portion 144c is used as a pad for connecting to a conductive element 154 (shown in FIG. 2F).

It should be noted that because top metal layer 118 in MIM region 11 is level with that in non-MIM region 12, the step difference and topography problem are resolved. In addition, MIM capacitor 120a in FIG. 1 is formed by using two masks to pattern CBM layer 122 or CTM layer 126. However, MIM capacitor 120b in FIG. 2D is formed only by using one mask to pattern insulating layer 124. Compared with MIM capacitor 120a in FIG. 1, MIM capacitor 120b in FIG. 2D is easy to fabricate, and therefore fabrication time and cost are reduced.

Furthermore, the formations of top metal layer 118 and metal pad 144 are compatible with the complementary metal oxide semiconductor (CMOS) process without additional process to form the bottom electrode and the top electrode of the MIM capacitor structure. Therefore, the fabrication process is simple and the fabrication cost is reduced.

Figure 2E:
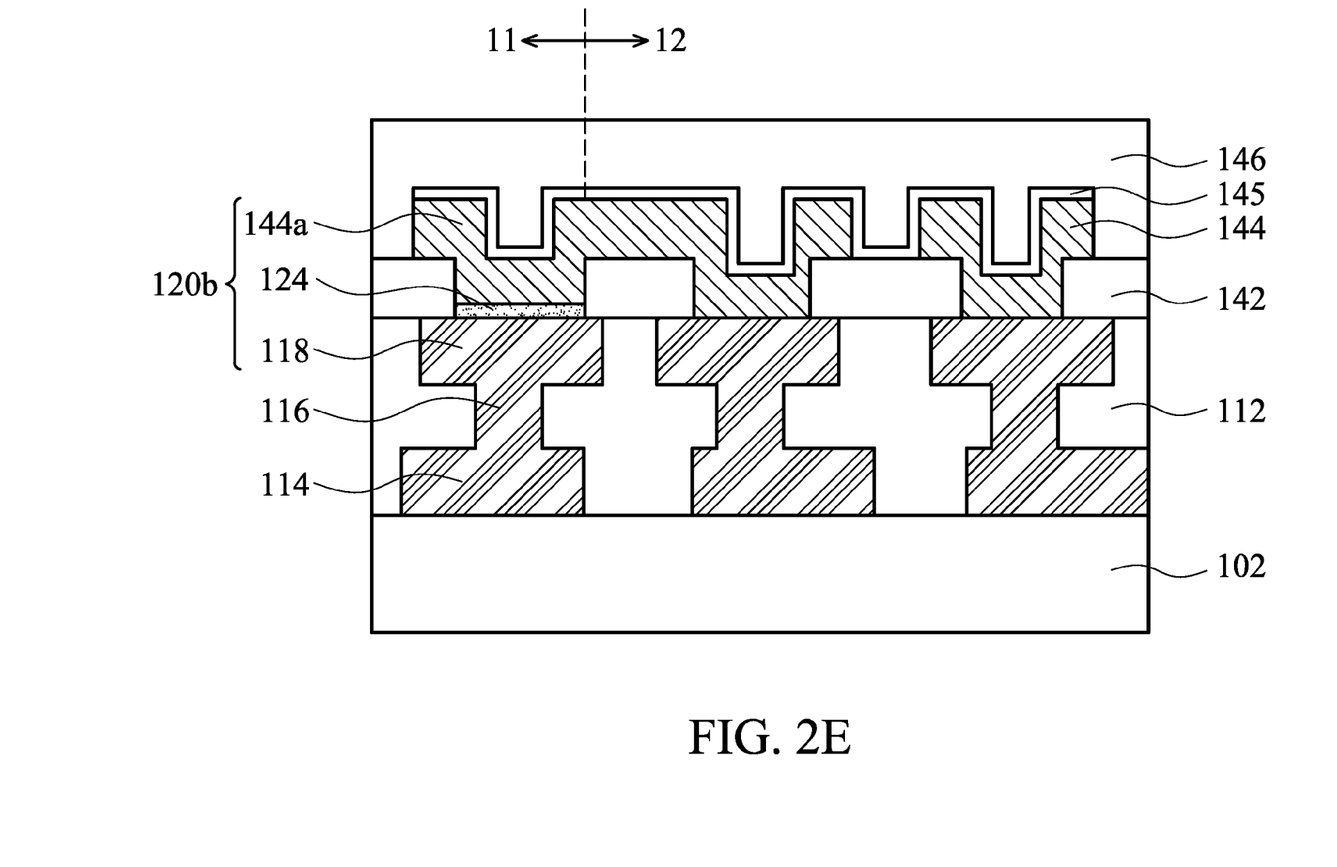

After metal pad 144 is patterned, second passivation layer 146 is formed on metal pad 144 and first passivation layer 142 as shown in FIG. 2E in accordance with some embodiments of the disclosure. In some embodiments, second passivation layer 146 is made of a material which is the same as first passivation layer 142.

Figure 2F:
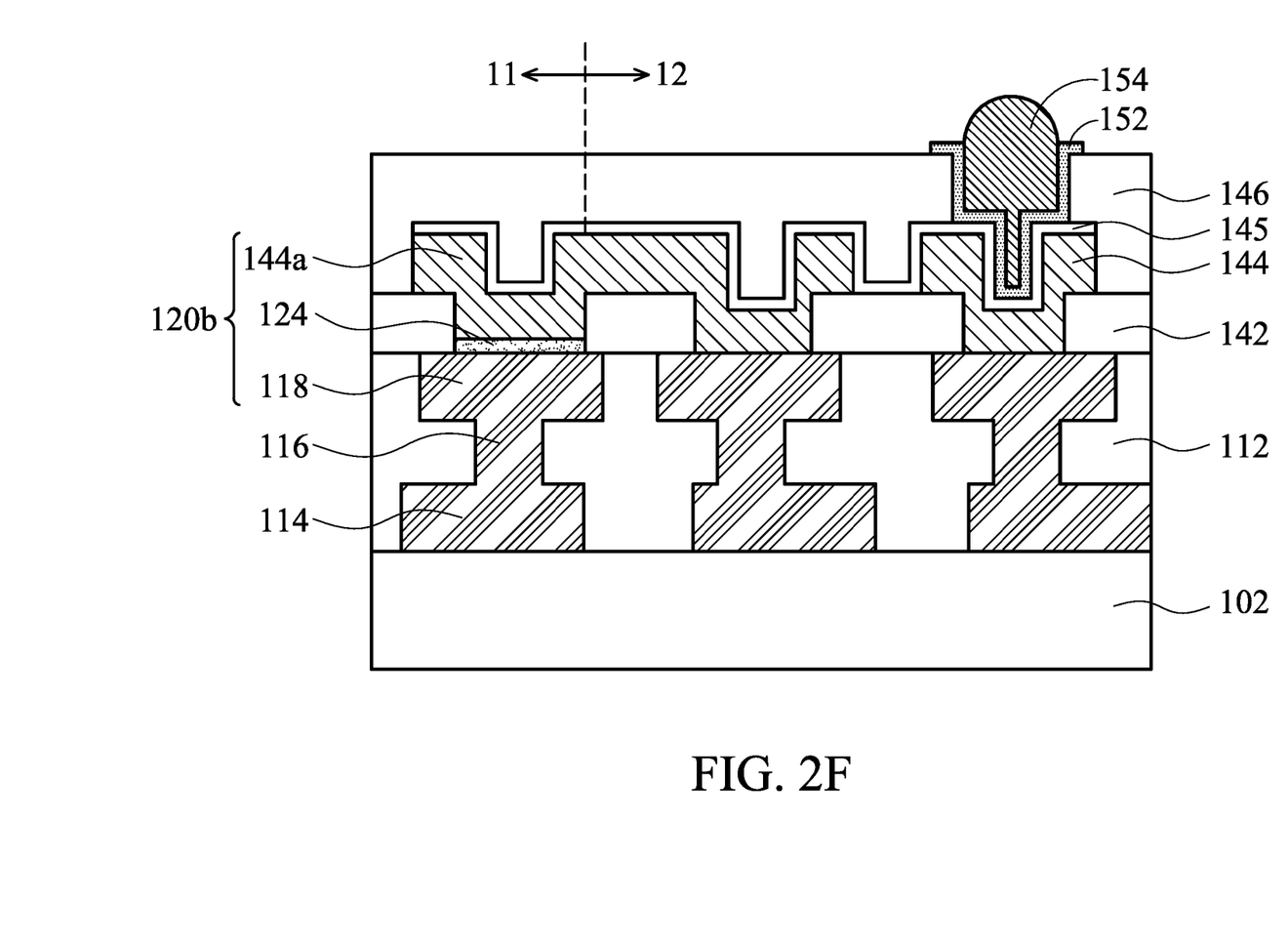

After second passivation layer 146 is formed, second passivation layer 146 is patterned to expose metal pad 144 as shown in FIG. 2F in accordance with some embodiments of the disclosure. Afterwards, an under bump metallurgy (UBM) layer 152 is formed on metal pad 144. UBM layer 152 may contain an adhesion layer and/or a wetting layer. In some embodiments, UBM layer 152 is made of titanium (Ti), titanium nitride (TiN), tantalum nitride (TaN), tantalum (Ta), or other applicable materials. In some embodiments, UBM layer 152 further includes a copper seed layer.

Afterwards, conductive element 154 (such as solder ball) is formed over UBM layer 152. In some embodiments, conductive element 154 is made of conductive materials with low resistivity, such as solder or solder alloy. Exemplary elements included in the solder alloy include Sn, Pb, Ag, Cu, Ni or Bi. Additional processes may be performed to complete the fabricating steps of semiconductor device.

Embodiments of mechanisms of forming a semiconductor device with a metal-insulator-metal (MIM) capacitor structure are provided. A top metal layer is used as a bottom electrode (plate) of the MIM capacitor. A metal pad is used as a top electrode (plate) of the MIM capacitor. The MIM capacitor is constructed by forming an insulating layer between the top metal layer and metal pad. The formations of the top metal layer and the metal pad are compatible with complementary metal oxide semiconductor (CMOS) process without additional process. Therefore, fabrication time and cost are reduced. In addition, because the top metal layer in the MIM region is level with that in the non-MIM region, the step difference and topography problem are resolved.

In some embodiments, a method for forming a metal-insulator-metal (MIM) capacitor structure is provided. The method includes providing a substrate and forming an interconnect structure over the substrate. The interconnect structure includes a top metal layer, and wherein the top metal layer comprises a first portion and a second portion. The method includes forming an insulating layer on the first portion of the top metal layer; and forming a metal pad on the insulating layer. The metal pad includes a first portion and a second portion, the MIM capacitor is constructed by the first portion of the top metal layer, the insulating layer and the first portion of the metal pad, and the second portion of the metal pad directly contacts the first portion of the metal pad and the second portion of the top metal layer.

In some embodiments, a method for forming a metal-insulator-metal (MIM) capacitor structure is provided. The method includes providing a substrate, and the substrate includes a MIM region and a non-MIM region. The method also includes forming a top metal layer over the substrate and forming an insulating layer over the top metal layer in the MIM region. The method further includes forming a top electrode on the insulating layer in the MIM region and a redistributing layer (RDL) on a second portion of the top metal layer in the non-MIM region. The RDL directly contacts the top electrode.

In some embodiments, a method for forming a metal-insulator-metal (MIM) capacitor structure is provided. The method includes providing a substrate, and the substrate includes a MIM region and a non-MIM region. The method includes forming a top metal layer over the substrate and forming an insulating layer over the top metal layer in the MIM region. The method further includes forming a first passivation layer over a portion of the top metal layer and patterning the first passivation layer to expose the insulating layer in the MIM region and a portion of the top metal layer in the non-MIM region. The method includes forming a metal pad on the insulating layer in the MIM region and on the portion of the top metal layer in the non-MIM region. The metal pad extends from MIM region to non-MIM region.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a metal-insulator-metal (MIM) capacitor structure, comprising:
   providing a substrate;
   forming an interconnect structure over the substrate, wherein the interconnect structure comprises a top metal layer, and wherein the top metal layer comprises a first portion and a second portion;
   forming an insulating layer on the first portion of the top metal layer;
   forming a first passivation layer on the top metal layer;
   patterning the first passivation layer to expose the insulating layer, wherein a bottom surface of the insulating layer is substantially level with a bottom surface of the first passivation layer; and
   forming a metal pad on the insulating layer, wherein the metal pad comprises a first portion and a second portion, the MIM capacitor is constructed by the first portion of the top metal layer, the insulating layer and the first portion of the metal pad, and the second portion of the metal pad directly contacts the first portion of the metal pad and the second portion of the top metal layer.

2. The method as claimed in claim 1, wherein the step of patterning the first passivation layer comprises
   forming a trench in the first passivation layer, wherein the insulating layer is exposed by the trench.

3. The method as claimed in claim 2, wherein the metal pad extends from in the trench to directly over a top surface of the first passivation layer.

4. The method as claimed in claim 2, further comprising:
   forming a second passivation layer over the metal pad and the first passivation layer after forming the metal pad; and
   patterning the second passivation layer to expose a portion of the metal pad.

5. The method as claimed in claim 4, further comprising:
   forming a UBM layer on the exposed metal pad after forming the second passivation layer.

6. The method as claimed in claim 5, wherein the metal pad further comprises a third portion, and the UBM layer is in contact with the third portion.

7. The method as claimed in claim 1, wherein forming the interconnect structure over the substrate comprises:
   forming an inter-metal dielectric (IMD) layer over the substrate; and
   forming a plurality of metal lines and vias in the IMD layer.

8. The method as claimed in claim 1, wherein the second portion of the metal pad is used as a redistribution layer (RDL).

9. A method for forming a metal-insulator-metal (MIM) capacitor structure, comprising:
   providing a substrate, wherein the substrate comprises a MIM region and a non-MIM region;
   forming a top metal layer over the substrate, wherein the top metal layer comprises a first portion and a second portion; forming an insulating layer over the first portion of the top metal layer in the MIM region;
   forming a first passivation layer on the top metal layer;
   patterning the first passivation layer to expose the insulating layer, wherein a bottom surface of the insulating layer is substantially level with a bottom surface of the first passivation layer; and
   forming a top electrode on the insulating layer in the MIM region and a redistributing layer (RDL) on the second portion of the top metal layer in the non-MIM region, wherein the RDL directly contacts the top electrode.

10. The method as claimed in claim 9, further comprising:
    forming a pad over a third portion of the top metal layer in the non-MIM region, wherein the pad, the top electrode and the RDL are simultaneously formed.

11. The method as claimed in claim 10, further comprising:
    forming a UBM layer on the pad; and
    forming a conductive element on the UBM layer.

12. The method as claimed in claim 11, wherein forming the conductive element on the UBM layer comprises:
    forming a second passivation layer over the first passivation layer;
    patterning the second passivation layer to form a hole; and
    forming the conductive element in the hole.

13. The method as claimed in claim 9, wherein the step of patterning the first passivation layer comprises
    patterning the first passivation layer to form a trench in the first passivation layer, wherein the insulating layer is exposed by the trench.

14. The method as claimed in claim 13, wherein the top electrode extends from in the trench to directly over a top surface of the first passivation layer.

15. The method as claimed in claim 9, wherein forming the top metal layer over the substrate comprises:
    forming an inter-metal dielectric (IMD) layer over the substrate; and
    forming a plurality of metal lines and vias in the IMD layer, wherein the IMD layer is made of a low-k material.

16. A method for forming a metal-insulator-metal (MIM) capacitor structure, comprising:
    providing a substrate, wherein the substrate comprises a MIM region and a non-MIM region;
    forming a top metal layer over the substrate;
    forming an insulating layer over the top metal layer in the MIM region;
    forming a first passivation layer over the top metal layer after forming the insulating layer;
    patterning the first passivation layer to expose the insulating layer in the MIM region and a portion of the top metal layer in the non-MIM region; and
    forming a metal pad having a first portion and a second portion, wherein the first portion is on the insulating layer in the MIM region and the second portion is on the portion of the top metal layer in the non-MIM region, wherein the metal pad extends from the MIM region to the non-MIM region, and the first portion directly contacts the second portion.

17. The method as claimed in claim 16, wherein the first portion of the metal pad in the MIM region is used as a top electrode, the second portion of the metal pad in the non-MIM region is used as a redistribution layer (RDL), and the first portion of the metal pad directly contacts the insulating layer.

18. The method as claimed in claim 17, wherein a bottom surface of the top electrode is higher than a bottom surface of the RDL.

19. The method as claimed in claim 16, further comprising:

forming a second passivation layer over the metal pad; and patterning the second passivation layer to form a hole in the second passivation layer.

20. The method as claimed in claim 19, further comprising:

forming a UBM layer in the hole; and forming a conductive element on the UBM layer.

\* \* \* \* \*